(12) United States Patent
Kawamura

(10) Patent No.: US 9,817,056 B2
(45) Date of Patent: Nov. 14, 2017

(54) INSULATION STATE DETECTING DEVICE

(71) Applicant: YAZAKI CORPORATION, Minato-ku, Tokyo (JP)

(72) Inventor: Yoshihiro Kawamura, Shizuoka (JP)

(73) Assignee: YAZAKI CORPORATION, Minato-ku, Tokyo (JP)

(*) Notice: Subject to any disclaimer, the term of this patent is extended or adjusted under 35 U.S.C. 154(b) by 54 days.

(21) Appl. No.: 14/333,749

(22) Filed: Jul. 17, 2014

(65) Prior Publication Data
US 2015/0022219 A1    Jan. 22, 2015

(30) Foreign Application Priority Data

Jul. 19, 2013  (JP) .................... 2013-150154

(51) Int. Cl.
*G01R 31/02* (2006.01)
*G01R 31/14* (2006.01)
*B60L 3/00* (2006.01)

(52) U.S. Cl.
CPC ............ *G01R 31/14* (2013.01); *B60L 3/0069* (2013.01); *G01R 31/024* (2013.01);
(Continued)

(58) Field of Classification Search
CPC .... G01R 31/025; G01R 27/18; G01R 31/007; G01R 31/006; G01R 31/028; G01R 31/1272; G01R 31/024; G01R 31/14; G01R 31/08; G01R 31/42; G01R 31/086; G01R 31/02; G01R 31/026; G01R 31/12; G01R 31/40; G01R 35/00; B60L 3/0069;
(Continued)

(56) References Cited

U.S. PATENT DOCUMENTS

| 4,929,903 A | 5/1990 | Saigo et al. |
| 2007/0210805 A1* | 9/2007 | Kawamura ............ G01R 31/44 324/541 |

(Continued)

FOREIGN PATENT DOCUMENTS

| CN | 1032239 A | 4/1989 |
| CN | 102539961 A | 7/2012 |

(Continued)

OTHER PUBLICATIONS

Communication, Jul. 18, 2016, from the State Intellectual Property Office of the P.R.C., in counterpart Chinese application No. 201410344645.7.

*Primary Examiner* — Alesa Allgood
(74) *Attorney, Agent, or Firm* — Sughrue Mion, PLLC

(57) ABSTRACT

In a high-speed measurement mode, a high-voltage measurement mode (V0 measurement) is omitted and only a negative-pole side ground fault resistor voltage measurement mode (VC1n measurement) and a positive-pole side ground fault resistor voltage measurement mode (VC1p measurement) are performed. In the negative-pole side ground fault resistor voltage measurement mode (VC1n measurement) and the positive-pole side ground fault resistor voltage measurement mode (VC1p measurement), the charging time for the flying capacitor is set to a second predetermined time period that is shorter than a first predetermined time period, which is different from basic operations in a normal measurement mode.

3 Claims, 3 Drawing Sheets

(52) U.S. Cl.
CPC ........ *G01R 31/025* (2013.01); *B60L 2240/80* (2013.01); *B60L 2250/10* (2013.01)

(58) Field of Classification Search
CPC ........... B60L 3/0023; B60L 3/04; H02H 3/16; H02H 3/337
USPC ..... 324/382, 519, 750.17, 754.28, 548, 541, 324/544, 551, 509, 512
See application file for complete search history.

(56) References Cited

U.S. PATENT DOCUMENTS

| | | | |
|---|---|---|---|
| 2010/0246081 A1 | 9/2010 | Yano et al. | |
| 2011/0006781 A1 | 1/2011 | Kawamura | |
| 2011/0084705 A1* | 4/2011 | Kawamura | G01R 27/025 324/551 |
| 2012/0081135 A1* | 4/2012 | Kawamura | G01R 27/025 324/693 |
| 2012/0153966 A1* | 6/2012 | Kawamura | G01R 31/028 324/548 |
| 2012/0262183 A1 | 10/2012 | Kawamura | |

FOREIGN PATENT DOCUMENTS

| | | | | |
|---|---|---|---|---|
| CN | 102735983 A | | 10/2012 | |
| JP | 2010-239822 A | | 10/2010 | |
| JP | 2011-017586 | * | 1/2011 | ............. G01R 31/02 |
| JP | 2011-17586 A | | 1/2011 | |

* cited by examiner (START)

INSULATION STATE DETECTING DEVICE

CROSS-REFERENCE TO RELATED APPLICATIONS

The present application claims priority to and incorporates by reference the entire contents of Japanese Patent Application No. 2013-150154 filed in Japan on Jul. 19, 2013.

BACKGROUND OF THE INVENTION

1. Field of the Invention

The present invention relates to an insulation state detecting device that detects a ground fault or the insulation state on a ground potential on the basis of the charging state of a flying capacitor.

2. Description of the Related Art

Electric vehicles and plug-in hybrid vehicles (PHVs) have been put into practical use and various types of such vehicles have been put on the market. In such vehicles, electric power is used as a power source and a high-voltage (200 V, for example) DC power source needs to be insulated from a vehicle body. An insulation state detecting device plays an important role, which detects a ground fault or the insulation state on a ground potential portion (ground potential) of such a DC power source.

This type of insulation state detecting device includes an already-known device with a flying capacitor charged by a DC power source. This insulation state detecting device charges the flying capacitor with a positive potential or a negative potential of the DC power source and measures the charging voltage by using a microcomputer, thereby detecting ground fault resistance or the insulation state on the positive-pole side or the negative-pole side.

For typical measurement of leakage of electricity on electric vehicles as described above, for example, high accuracy of measurement is focused on in terms of excluding erroneous detections. Various types of technologies have been developed for that purpose (refer to Japanese Patent Application Laid-open No. 2010-239822 and Japanese Patent Application Laid-open No. 2011-017586, for example). With the technology disclosed in Japanese Patent Application Laid-open No. 2010-239822, a ceramic capacitor is used as a flying capacitor, thereby achieving both the downsize of a measuring device and the insulation resistance measurement with high accuracy. With the technology disclosed in Japanese Patent Application Laid-open No. 2011-017586, suppressing effectively any erroneous detection to be generated due to noise components during the measurement is achieved.

As disclosed in Japanese Patent Application Laid-open No. 2010-239822 and Japanese Patent Application Laid-open No. 2011-017586, a typical insulation state detecting device (a leak measurement means) in which the detection accuracy is focused on takes an important role in particular when a vehicle is normally used. The technology focusing only on the detection accuracy as described above, however, is not sufficient for an unexpected situation where any leakage failure such as an accident occurs. Another technology has been therefore desired for determining important matters including the possibility of an electric shock in a time period as short as possible, rather than the determining technology focusing on the detection accuracy.

In view of the conventional circumstances, the present invention aims to provide a technology for solving the issues described above.

SUMMARY OF THE INVENTION

It is an object of the present invention to at least partially solve the problems in the conventional technology.

According to one aspect of the present invention, an insulation state detecting device includes a flying capacitor configured to be charged with a voltage corresponding to a ground fault resistor by a DC power source insulated from a ground potential portion; a measuring circuit configured to couple in series the flying capacitor insulated from the DC power source after being charged by the DC power source to between the ground potential portion and a measurement unit that measures a charging voltage of the flying capacitor, thereby detecting an insulation state based on a measurement result of the charging voltage of the flying capacitor obtained by the measurement unit; and a measurement control unit configured to measure at least one of a negative-pole side ground fault resistor voltage and a positive-pole side ground fault resistor voltage with a shorter time period for charging the flying capacitor than a normal measurement time period, when an equipment an insulation state of which is detected is being started or a measurement mode is a high-speed measurement mode, and configured to determine the insulation state based on the measurement result.

According to another aspect of the present invention, the measurement control unit measures the negative-pole side ground fault resistor voltage and the positive-pole side ground fault resistor voltage in a shorter time period than the normal measurement time period, and determines the insulation state based on the measurement results.

According to still another aspect of the present invention, the measurement control unit determines that the insulation state is inappropriate when a sum of measured values of the negative-pole side ground fault resistor voltage and the positive-pole side ground fault resistor voltage is equal to or larger than a predetermined value.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

The following describes an embodiment of the present invention (hereinafter referred to as an "embodiment") with reference to the accompanying drawings.

Figure 1:
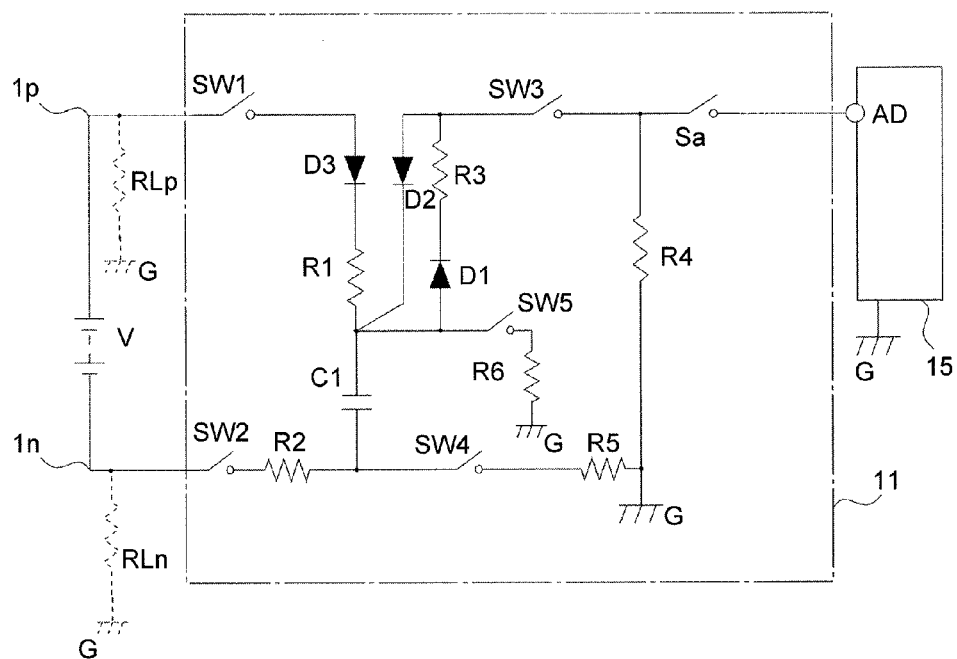
FIG. 1 is a circuit diagram of a ground fault sensor according to an embodiment of the present invention.

FIG. 1 is a circuit diagram illustrating the structure of an insulation measuring circuit 10 according to an embodiment of the present invention. As illustrated in FIG. 1, the insulation measuring circuit 10 includes a detection circuit 11 and a microcomputer 15 (a determination control unit) and checks the insulation state of a high-voltage power source V coupled to the detection circuit 11, thereby detecting leakage of electricity. Specifically, the insulation measuring circuit 10 detects the insulation state of a positive-pole side ground fault resistor RLp serving as an insulation resistor on the positive-pole side of the power source V and the insulation state of a negative-pole side ground fault resistor RLn serving as an insulation resistor on the negative-pole side of the power source V. The positive-pole side ground fault resistor RLp is a virtual resistor if any ground fault occurs on a main circuit wire 1p on the positive terminal side. The negative-pole side ground fault resistor RLn is a virtual resistor if any ground fault occurs on a main circuit wire 1n on the negative terminal side.

The microcomputer 15 includes an input port AD, and has the function of AD-converting voltages (VC1p, VC1n, and V0) input to the input port AD and measuring the converted voltages. The microcomputer 15 also has the function of controlling the open and close of a first switch SW1 to a fifth switch SW5 provided in the detection circuit 11 as described later. In addition, the microcomputer 15 performs insulation resistance conversion on the voltages (VC1p, VC1n, and V0) input to the input port AD according to a predetermined computation expression, for example, VC1/V0. The microcomputer 15 stores insulation resistance values corresponding to the computation expression VC1/V0 as a predetermined table. The microcomputer 15 determines the insulation state with reference to the table. The voltages (VC1p, VC1n, and V0) input to the input port AD will be described in detail later.

In the detection circuit 11, the first switch SW1, a first resistor R1, a flying capacitor C1, a second resistor R2, and a second switch SW2 are disposed in series in this order from the positive-pole side to the negative-pole side of the power source V. In the descriptions below, the resistance values of resistors are presented as the same symbols of the respective resistors (for example, the resistance value of the first resistor R1 is also presented as R1). The positions of the first switch SW1 and the first resistor R1 may be exchanged with each other. In the same manner, the positions of the second switch SW2 and the second resistor R2 may be exchanged with each other. The resistance value of the first resistor R1 is set equal to the resistance value of the second resistor R2. As illustrated in FIG. 1, a third diode D3 may be disposed between the first switch SW1 and the first resistor R1.

Starting from the terminal on the positive-pole side (the terminal on the upstream side) coupled to the first resistor R1 out of the terminals of the flying capacitor C1, a first diode D1, a third resistor R3, a third switch SW3, a fourth resistor R4, a fifth resistor R5, and a fourth switch SW4 are disposed in series and coupled to the terminal (the terminal on the downstream side) of the flying capacitor C1 coupled to the second resistor R2. In addition, starting from the terminal point on the way of the path where the flying capacitor C1 and the first diode D1 are coupled to each other, a fifth switch SW5 serving as a discharging switch and a sixth resistor R6 are disposed in series and coupled to a ground potential G.

Starting from the terminal point where the third resistor R3 and the third switch SW3 are coupled to each other, a second diode D2 is coupled to the terminal on the upstream side of the flying capacitor C1. That is, the second diode D2 is coupled in parallel with the path where the first diode D1 and the third resistor R3 are coupled to each other. The forward direction of the first diode D1 is a direction from the flying capacitor C1 (the terminal on the upstream side) to the third resistor R3. The forward direction of the second diode D2 is a direction from the third resistor R3 to the flying capacitor C1 (the terminal on the upstream side).

Furthermore, an analog to digital (AD) read-in switch Sa is disposed between the terminal point on the way of the path where the third switch SW3 is coupled to the fourth resistor R4, and the input port AD of the microcomputer 15. As a typical data read-in circuit (not illustrated), a protecting resistor, for example, is also disposed.

The terminal point on the way of the path where the fourth resistor R4 and the fifth resistor R5 are coupled to each other is coupled to a ground potential G. The resistance value of the fifth resistor R5 is set equal to the resistance value of the fourth resistor R4.

Figure 2:
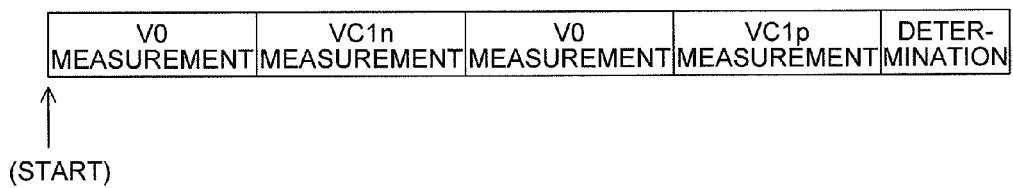
FIG. 2 is a chart of a ground fault measurement cycle normally used according to the embodiment of the present invention.
Figure 3:
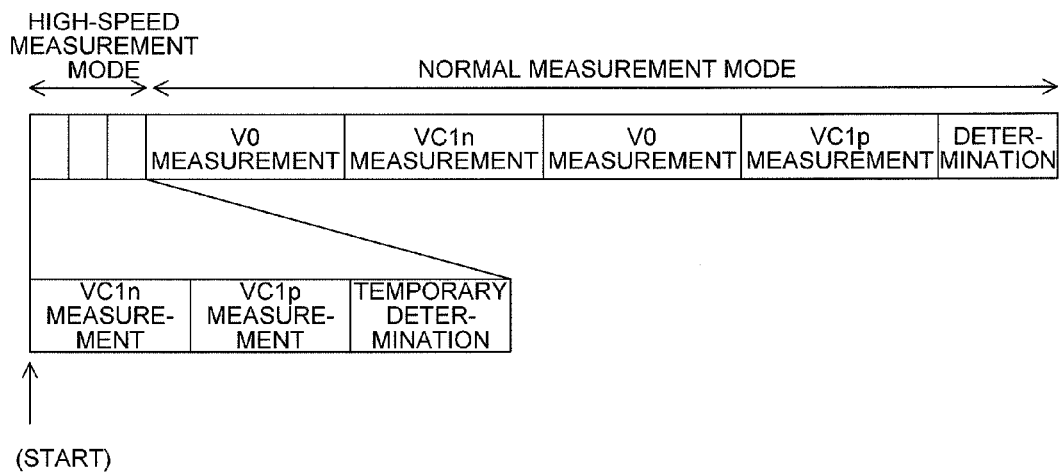
FIG. 3 is a chart of a ground fault measurement cycle used immediately after an operation is started or a high-speed measurement signal is on according to the embodiment of the present invention.
Figure 4:
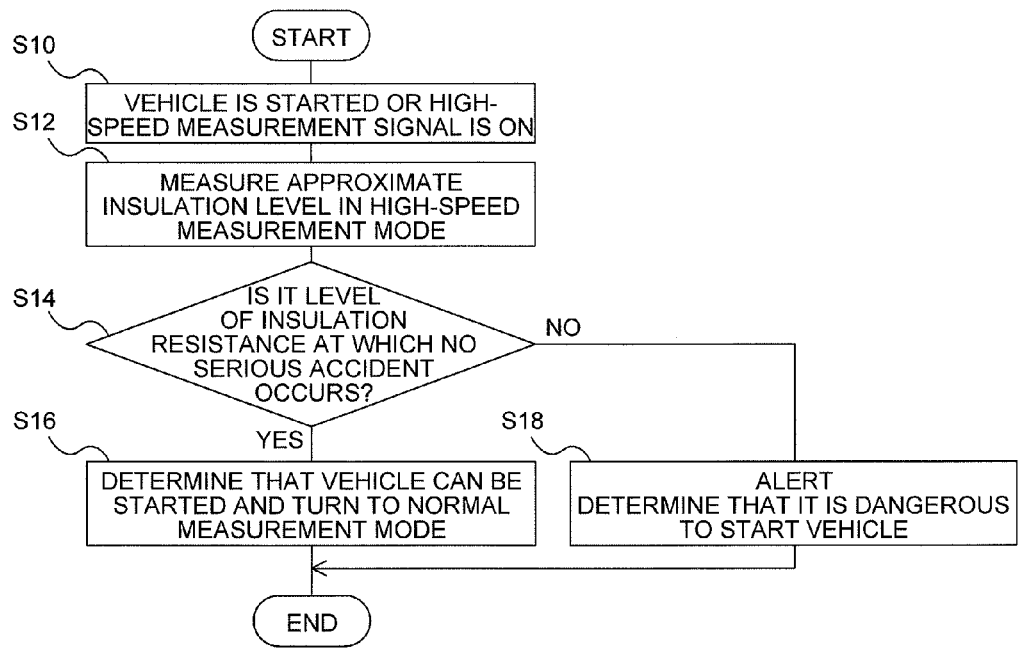
FIG. 4 is a flowchart of an example of control with the ground fault sensor according to the embodiment of the present invention.
Figure 5A:
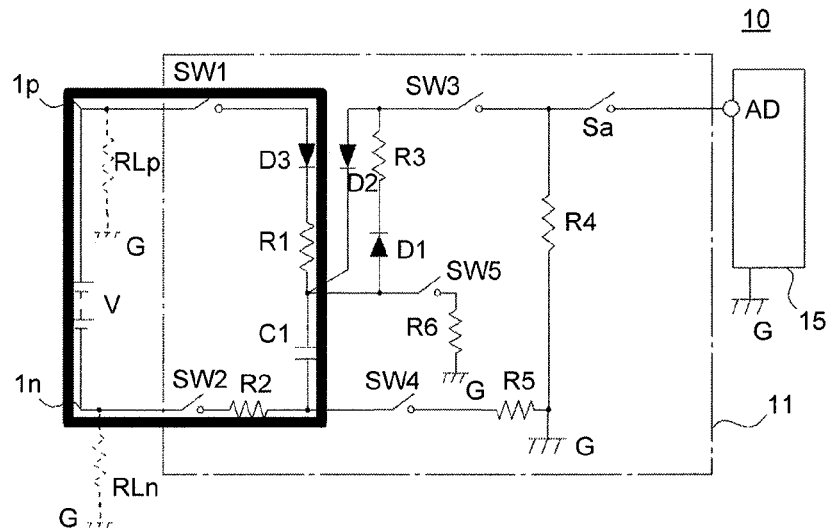
FIG. 5A to 5C are closed circuit diagrams formed in respective measurement modes according to the embodiment of the present invention.
Figure 5B:
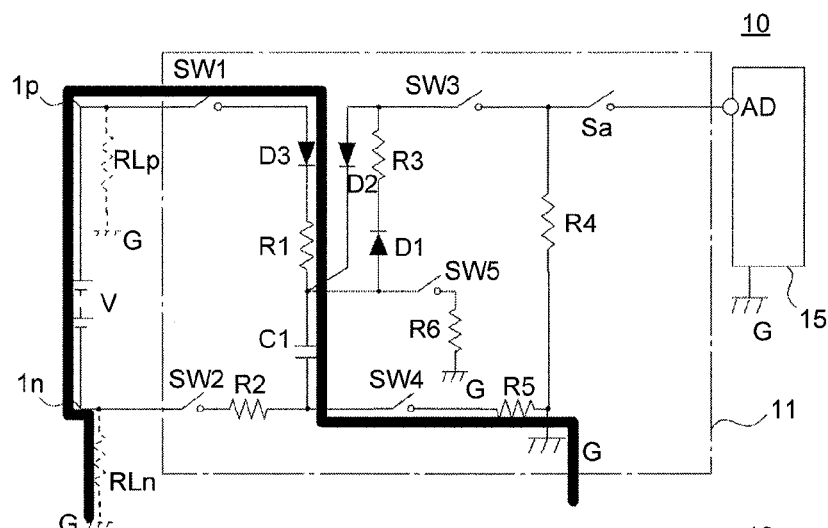
Figure 5C:
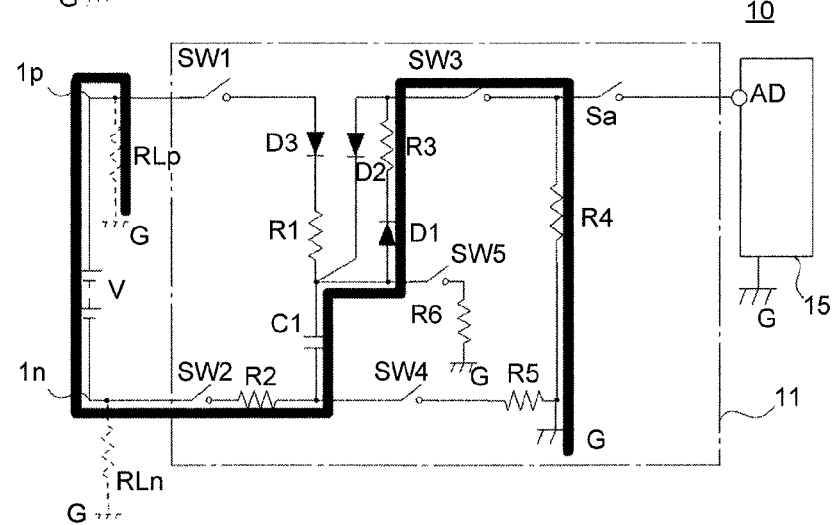

The following describes determining procedures of the insulation state of the power source V with the above-described structure with reference to FIGS. 2 to 5C. FIG. 2 is a chart of a ground fault measurement cycle normally used. FIG. 3 is a chart of a ground fault measurement cycle used immediately after an operation is started or a high-speed measurement signal is on. FIG. 4 is a flowchart of an example of control with the ground fault sensor. FIGS. 5A to 5C are closed circuit diagrams formed in respective measurement modes.

In the basic operations in the measurement mode normally used (hereinafter referred to as a "normal measurement mode") that have been conventionally performed, as illustrated in FIG. 2, a high-voltage V0 measurement mode (V0 measurement), a negative-pole side ground fault resistor voltage VC1n measurement mode (VC1n measurement), a high-voltage V0 measurement mode (V0 measurement), a positive-pole side ground fault resistor voltage VC1p measurement mode (VC1p measurement), and an insulation resistance converting mode (a determination mode) are performed sequentially. The following describes in detail circuit operations for the measurement modes. The charging time in the measurement mode normally used is set to the time period required for fully charging the flying capacitor C1 (a first predetermined time period t1).

1) High-Voltage V0 Measurement Mode (V0 Measurement):

As illustrated with the thick line in FIG. 5A, the microcomputer 15 turns the first switch SW1 and the second switch SW2 to on for the first predetermined time period t1, and sets a voltage V0 (hereinafter referred to as a "high voltage V0") supplied from the power source V on the flying capacitor C1. The microcomputer 15 then turns the first switch SW1 and the second switch SW2 to off, and turns the third switch SW3 and the fourth switch SW4 to on. This enables the input port AD to measure the value (a divided voltage value of the high voltage V0) corresponding to the high voltage V0 set on the flying capacitor C1. After the measurement ends, the microcomputer 15 turns the third switch SW3 to off, and turns only the fourth switch SW4 and the fifth switch SW5 to on to discharge the electric charge of the flying capacitor C1.

2) Negative-Pole Side Ground Fault Resistor Voltage VC1n Measurement Mode (VC1n Measurement):

As illustrated with the thick line in FIG. 5B, the microcomputer 15 turns the first switch SW1 and the fourth switch SW4 to on, and sets a voltage supplied from the power source V with the negative-pole side ground fault resistor RLn (hereinafter referred to as a "negative-pole side ground fault resistor voltage VC1n") on the flying capacitor C1. The microcomputer 15 then turns the second switch SW2 to off and turns the fourth switch SW4 to on. This enables the input port AD to measure the value (a divided voltage value of the high voltage VC1n) corresponding to the negative-pole side ground fault resistor voltage VC1n set on the flying capacitor C1. After the measurement ends, the microcomputer 15 turns the third switch SW3 to off and turns only the fourth switch SW4 and the fifth switch SW5 to on to discharge the electric charge of the flying capacitor C1. The positive-pole side ground fault resistor voltage VC1p and the negative-pole side ground fault resistor voltage VC1n are hereinafter collectively referred to as a "ground fault resistor voltage VC1 (the charging voltage)", unless they are distinguished from each other.

3) Positive-Pole Side Ground Fault Resistor Voltage VC1p Measurement Mode (VC1p Measurement):

As illustrated with the thick line in FIG. 5C, the microcomputer 15 turns the second switch SW2 and the third switch SW3 to on, and sets a voltage supplied from the power source V with the positive-pole side ground fault resistor RLp (hereinafter referred to as a "positive-pole side ground fault resistor voltage VC1p") on the flying capacitor C1. The microcomputer 15 then turns the second switch SW2 to off and turns the fourth switch SW4 to on. This enables the input port AD to measure the value (a divided voltage value of the positive-pole side ground fault resistor voltage VC1p) corresponding to the positive-pole side ground fault resistor voltage VC1p set on the flying capacitor C1. After the measurement ends, the microcomputer 15 turns the third switch SW3 to off and turns only the fourth switch SW4 and the fifth switch SW5 to on to discharge the electric charge of the flying capacitor C1.

4) Insulation Resistance Converting Mode (Determination Mode):

The microcomputer 15 performs a predetermined insulation resistance conversion based on the above-described measurement results. A lowered insulation level at one pole side increases the ground fault resistor voltage VC1 (VC1p or VC1n) at the pole on the insulated side, which makes the voltage at the side of the lowered insulation level 0V.

With generally known technologies, the normal measurement mode is performed also at the start of a vehicle. With the specific structure according to the present embodiment, the following high-speed measurement mode is performed at the start of a vehicle or when a predetermined signal is on (a flag for performing the high-speed measurement mode is on). This achieves a process in which the determining time period precedes the detection accuracy.

The following describes the operations in the high-speed measurement mode with reference to FIG. 3. If it is determined that the insulation state is appropriate in the high-speed measurement mode, the process sequence proceeds to the normal measurement mode.

In the high-speed measurement mode, the high-voltage V0 measurement mode (V0 measurement) is omitted and only the negative-pole side ground fault resistor voltage VC1n measurement mode (VC1n measurement) and the positive-pole side ground fault resistor voltage VC1p measurement mode (VC1p measurement) are performed.

In the negative-pole side ground fault resistor voltage VC1n measurement mode (VC1n measurement) and the positive-pole side ground fault resistor voltage VC1p measurement mode (VC1p measurement), the charging time for the flying capacitor C1 is set to a second predetermined time period t2 shorter than the first predetermined time period t1. This is different from the basic operations in the normal measurement mode.

After the measurement in the negative-pole side ground fault resistor voltage VC1n measurement mode (VC1n measurement) and the measurement in the positive-pole side ground fault resistor voltage VC1p measurement mode (VC1p measurement) are performed with the flying capacitor C1 charging time of the second predetermined time period t2, the microcomputer 15 performs temporary determination based on the measurement results. In the temporary determination, the microcomputer 15 calculates the sum of the measured values (VC1n+VC1p) and compares it with a predetermined determination threshold value. According to the comparison, the microcomputer 15 determines (1) "whether leakage of electricity is occurring" and (2) "to which the level of risk the insulation level is lowered".

In the high-speed measurement mode, the information on the high voltage V0 cannot be acquired because the high-voltage V0 measurement mode (V0 measurement) is omitted. In addition, the time for measuring the ground fault resistor voltage VC1 is so short that the electric charge charged on the ground fault resistor voltage VC1 is insufficient. The level of measurement accuracy the same as that in the normal measurement mode cannot be expected, however, the insulation state (an approximate insulation level) can be acquired in a very short time to the extent that enables determination of the above-described risk. As a result, general safety at the start of a vehicle can be known in a short time. The determined level of risk includes an insulation level at which a vehicle can be moved and an insulation level at which a serious accident may occur such as an electric shock and a fire.

The following describes a process for determining the risk at the start of a vehicle with reference to the flowchart in FIG. 4. The vehicle is capable of performing the high-speed measurement mode and the normal measurement mode described above.

If a vehicle is started or a flag for performing the high-speed measurement mode (a high-speed measurement signal) is on (S10), the microcomputer 15 measures an approximate insulation level in the high-speed measurement mode (S12). In other words, the negative-pole side ground fault resistor voltage VC1n measurement mode (VC1n measurement) and the positive-pole side ground fault resistor voltage VC1p measurement mode (VC1p measurement) are performed with the flying capacitor C1 charging time of the second predetermined time period t2 as described above.

Subsequently, the microcomputer 15 compares a sum of the measured values (VC1n+VC1p) with a predetermined determination threshold value and determines whether the sum is in the level of insulation resistance at which no serious accident occurs (S14).

If the microcomputer 15 determines that the sum is in the level of insulation resistance at which no serious accident occurs (Yes at S14), the microcomputer 15 determines that it is safe to start the vehicle and turns the measurement mode of the insulation resistance to the normal measurement mode (S16).

If the microcomputer 15 determines that the sum is in the level of insulation resistance at which a serious accident may occur (No at S14), the microcomputer 15 determines that the insulation state is inappropriate, that is, it is dangerous to start the vehicle. The microcomputer 15 then issues an alert through a display unit and/or an audio output unit of the vehicle. The microcomputer 15 may also notify a control device (not illustrated) of the vehicle of the level of insulation resistance (S18). After receiving the notification, the control device prohibits the vehicle from being started or implements predetermined protection measures on the vehicle according to the received level of insulation resistance.

As described above, only if the minimum safety of the vehicle is confirmed in the high-speed measurement mode immediately after the start of the vehicle, the microcomputer 15 turns the mode to the normal measurement mode for acquiring information with higher accuracy. In addition, if a control is available that can identify a possibly problematic part coupled to a high voltage system, the part causing a leakage of electricity can be readily identified and maintained. As a result, if the minimum safety of the vehicle in which no serious accident occurs is confirmed firstly, an appropriate risk avert action can be taken, such as moving the vehicle to a safe place for evacuation.

The embodiment according to the present invention has been described. The embodiment has been presented by way of example. It is apparent to those skilled in the art that numerous modifications of the components in the embodiment and their combinations can be available within the scope of the present invention.

In the present embodiment, the structure of the circuit is exemplified by the insulation measuring circuit 10 illustrated in FIG. 1. This, however, does not limit the present embodiment. Various insulation measuring circuits with other components can be applied to the embodiment. The above-described charging time (the first predetermined time period t1 or the second predetermined time period t2) is set according to the applied insulation measuring circuit. The measurement in the negative-pole side ground fault resistor voltage VC1n measurement mode (VC1n measurement) may be performed after the measurement in the positive-pole side ground fault resistor voltage VC1p measurement mode (VC1p measurement). For the temporary determination, the sum of the measured values (VC1n+VC1p) is compared with a predetermined determination threshold value. The value used for the determination, however, is not limited to the sum. The temporary determination may be performed by using one of the measured values (VC1n or VC1p). The temporary determination may also be performed by using one of the measured values (VC1n or VC1p) in addition to the sum of the measured values (VC1n+VC1p). For a measure against noise in the system, a capacitor called a Y capacitor may be used. In this case, for reducing an influence of the Y capacitor, the positive-pole side ground fault resistor voltage VC1p may be measured when a given time period has passed after the negative-pole side ground fault resistor voltage VC1n is measured, and then the sum of the measured values (VC1n+VC1p) is used for the determination. In addition, the high voltage V0 may be externally acquired, that is, only the negative-pole side ground fault resistor voltage VC1n and the positive-pole side ground fault resistor voltage VC1p may be measured for calculating the ground fault resistance value.

According to an aspect of the present invention, appropriate determination whether insulation state is appropriate can be achieved at a constant level in a short period of time.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An insulation state detecting device for detecting an insulation state of a DC power source of a motor vehicle, the insulation state detecting device comprising:
   a detection circuit comprising a flying capacitor configured to be charged with a voltage corresponding to a ground fault resistor by the DC power source insulated from a ground potential portion; and
   a microcomputer configured to:
      couple in series the flying capacitor insulated from the DC power source after being charged by the DC power source to between the ground potential portion and measure a charging voltage of the flying capacitor, thereby detecting the insulation state of the DC power source based on a measurement result of the charging voltage of the flying capacitor,
      measure a ground fault resistor voltage of at least one of a negative-pole side ground fault resistor voltage and a positive-pole side ground fault resistor voltage upon charging the flying capacitor for a shortened time period that is shorter than a normal measurement time period, when the motor vehicle is being started, and
      determine the insulation state by comparing the ground fault resistor voltage to a predetermined threshold that indicates an insulation level at which the vehicle is safe to operate,
   wherein the normal measurement time period is a period of time required to fully charge the flying capacitor when a closed circuit is formed with an anode and a cathode of the DC power source.

2. An insulation state detecting device for detecting an insulation state of a DC power source of a motor vehicle, the insulation state detecting device comprising:
   a detection circuit comprising a flying capacitor configured to be charged with a voltage corresponding to a ground fault resistor by the DC power source insulated from a ground potential portion; and
   a microcomputer configured to:
      couple in series the flying capacitor insulated from the DC power source after being charged by the DC power source to between the ground potential portion and measure a charging voltage of the flying capacitor, thereby detecting the insulation state of the DC power source based on a measurement result of the charging voltage of the flying capacitor,
      measure a round fault resistor voltage of at least one of a negative-pole side ground fault resistor voltage and a positive-pole side ground fault resistor voltage upon charging the flying capacitor for a shortened time period that is shorter than a normal measurement time period required for the DC power source to fully charge the flying capacitor, when the motor vehicle being started, and
      determine the insulation state by comparing the ground fault resistor voltage to a predetermined threshold that indicates an insulation level at which the vehicle is safe to operate,
   wherein the microcomputer is configured to determine that the insulation state is unsafe when a sum of measured values of the negative-pole side ground fault resistor voltage and the positive-pole side ground fault resistor voltage is equal to or larger than the predetermined threshold.

3. The insulation state detecting device according to claim 1, wherein the microcomputer determines that the insulation state is unsafe if a sum of measured values of the negative-pole side ground fault resistor voltage and the positive-pole side ground fault resistor voltage is equal to or larger than the predetermined threshold.

* * * * *